United States Patent
Watanabe et al.

(10) Patent No.: US 9,388,495 B2
(45) Date of Patent: Jul. 12, 2016

(54) METHOD OF FORMING MASK STRUCTURE

(71) Applicant: TOKYO ELECTRON LIMITED, Tokyo (JP)

(72) Inventors: Masahisa Watanabe, Nirasaki (JP); Hiroshi Kubota, Nirasaki (JP); Kazuaki Chiba, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 14/528,047

(22) Filed: Oct. 30, 2014

(65) Prior Publication Data

US 2015/0125606 A1 May 7, 2015

(30) Foreign Application Priority Data

Nov. 5, 2013 (JP) .................................. 2013-228952
Sep. 16, 2014 (JP) .................................. 2014-188060

(51) Int. Cl.
C23C 16/04 (2006.01)
C23C 16/08 (2006.01)
C23C 16/458 (2006.01)
C23C 16/24 (2006.01)
H01L 21/311 (2006.01)

(52) U.S. Cl.
CPC .............. C23C 16/4583 (2013.01); C23C 16/08 (2013.01); C23C 16/24 (2013.01); H01L 21/31144 (2013.01)

(58) Field of Classification Search
CPC ........ C23C 16/04; C23C 16/08; C23C 16/24; C23C 16/52
See application file for complete search history.

(56) References Cited

U.S. PATENT DOCUMENTS

| 5,652,474 A * | 7/1997 | Wilshaw ................. H01J 9/025 313/309 |
| 2004/0171241 A1* | 9/2004 | Kitamura ........... H01L 21/28247 438/592 |
| 2005/0003653 A1* | 1/2005 | Kanamura ........ H01L 21/76811 438/622 |
| 2007/0059945 A1* | 3/2007 | Mohklesi .............. C23C 16/308 438/778 |
| 2009/0093120 A1* | 4/2009 | Hirota ............... H01L 21/02115 438/694 |
| 2010/0024732 A1* | 2/2010 | Mokhlesi .............. C23C 16/308 118/724 |
| 2010/0055904 A1* | 3/2010 | Chen ................... C23C 16/0281 438/680 |
| 2012/0244712 A1* | 9/2012 | Tsubata .............. H01L 21/0332 438/703 |

FOREIGN PATENT DOCUMENTS

| JP | 61-220468 A | 9/1986 |
| JP | 10-050954 A | 2/1998 |

(Continued)

OTHER PUBLICATIONS

Goodyear, Andrew, L., et al., "High resolution inductively coupled plasma etching of 30 nm lines and spaces in tungsten and silicon". J. Vac. Sci. Technol. B 18(6), Nov./Dec. 2000, pp. 3471-3475.*

(Continued)

*Primary Examiner* — Bret Chen
(74) *Attorney, Agent, or Firm* — Nath, Goldberg & Meyer; Jerald L. Meyer

(57) ABSTRACT

A method of forming an etching mask structure on an insulating film containing silicon and oxygen includes forming a first silicon film on the insulating film formed on a substrate, forming a reaction blocking layer on a surface layer of the first silicon film, forming a second silicon film on the reaction blocking layer; and forming a tungsten film by replacing silicon of the second silicon film with tungsten by supplying a process gas containing a tungsten compound onto the second silicon film.

6 Claims, 27 Drawing Sheets

(56) References Cited

FOREIGN PATENT DOCUMENTS

| | | |
|---|---|---|
| JP | 2004-193633 A | 7/2004 |
| JP | 2004-247472 A | 9/2004 |
| JP | 2006-245538 A | 9/2006 |
| JP | 2008-240158 A | 10/2008 |

OTHER PUBLICATIONS

Hagglund, Victor, "Characterization of masking layers for deep wet etching in borofloat glass". Uppsala Universitet, Examensarbete 30 hp, Jun. 2013, pp. 1-36.*

* cited by examiner

METHOD OF FORMING MASK STRUCTURE

CROSS-REFERENCE TO RELATED APPLICATIONS

This application claims the benefit of Japanese Patent Application Nos. 2013-228952, filed on Nov. 5, 2013, and 2014-188060, filed on Sep. 16, 2014, in the Japan Patent Office, the disclosure of which is incorporated herein in their entirety by reference.

TECHNICAL FIELD

The present disclosure relates to a method of forming a mask structure including a tungsten (W) film, a film forming apparatus and a non-transitory storage medium.

BACKGROUND

For example, in a process of forming a capacitor of a DRAM (Dynamic Random Access Memory), studies have been done to form a relatively deep concave portion in a silicon oxide ($SiO_2$) film. To this end, there is a need to form a mask film having high etching selectivity with regard to the $SiO_2$ film on the $SiO_2$ film. That is, there is a need to form a mask film having high etching resistance on the $SiO_2$ film when the $SiO_2$ film is etched. In addition, techniques for forming a W film are known in related arts.

As the mask film, a silicon (Si) film or a Si film doped with impurities has been used. However, it has been known from evaluation on etching resistance that a W film is higher in etching resistance than the Si film and therefore studies have been done to form the W film as the mask film. However, since the W film has low adhesion to the $SiO_2$ film, when the W film is directly formed on the $SiO_2$ film, the W film may be peeled off, thus causing the $SiO_2$ film to be damaged by sputtering.

In order to increase the adhesion, it is considered to form a titanium nitride (TiN) film, which serves as an adhesion layer to the $SiO_2$ film, on the $SiO_2$ film and form a W film using the TiN film as a base (adhesion layer). A method of forming the W film using the TiN as the base will be described in detail below. First, the TiN film is formed on a $SiO_2$ film of a substrate, and a monosilane ($SiH_4$) gas is supplied onto the substrate. The $SiH_4$ gas is supplied to increase activated sites on the TiN film, promoting growth of the W film and increasing the density of the W film. Thereafter, a tungsten hexafluoride ($WF_6$) gas and a $SiH_4$ gas are, for example, alternately supplied to form a seeding layer (W film). Thereafter, a $WF_6$ gas and a hydrogen ($H_2$) gas are supplied to form the W film. The W film formed by the $WF_6$ gas and the $H_2$ gas has a lower resistance, fewer impurities, and a higher crystallinity than the seeding layer. In addition, it is difficult to grow the W film using the $WF_6$ gas and the $H_2$ gas without forming the seeding layer.

However, since the method of forming the W film using the TiN film as the base requires the supply of various gases after forming the TiN film, the number of steps in the method are increased, thus taking more time and effort. Accordingly, there is a need to save time and effort in forming the W film and provide high uniformity in thickness of the W film in a plane of the substrate and between substrates.

SUMMARY

Some embodiments of the present disclosure provide techniques for forming an insulating film etching mask structure on an insulating film containing silicon and oxygen, preventing a tungsten film constituting the mask structure from being peeled off, and controlling the thickness of the tungsten film with high precision.

According to an embodiment of the present disclosure, a method of forming an etching mask structure on an insulating film containing silicon and oxygen is provided. The method includes: forming a first silicon film on the insulating film formed on a substrate; forming a reaction blocking layer on a surface layer of the first silicon film; forming a second silicon film on the reaction blocking layer; and forming a tungsten film by substituting silicon of the second silicon film with tungsten by supplying a process gas containing a tungsten compound onto the second silicon film.

According to another embodiment of the present disclosure, an apparatus for performing a film forming process for a substrate loaded in a reaction container is provided. The apparatus includes: a heating mechanism configured to heat the substrate in the reaction container; a first gas supply unit configured to supply a silicon film forming gas used to form a silicon film on the substrate into the reaction container; a second gas supply unit configured to supply a reaction blocking layer forming gas used to form a reaction blocking layer on a surface layer of the silicon film into the reaction container; a third gas supply unit configured to supply a tungsten film forming gas containing a tungsten compound used to replace silicon of the silicon film with tungsten into the reaction container; a pressure adjusting unit configured to adjust an internal pressure of the reaction container; and a control unit configured to control the heating mechanism, the first gas supply unit, the second gas supply unit, the third gas supply unit, and the pressure adjusting unit to perform a process of: forming a first silicon film on an insulating film mainly containing silicon and oxygen and formed on the substrate by supplying the silicon film forming gas into the reaction container; forming the reaction blocking layer on a surface layer of the first silicon film by supplying the reaction blocking layer forming gas into the reaction container; forming a second silicon film on the reaction blocking layer by supplying the silicon film forming gas into the reaction container; and substituting silicon of the second silicon film with tungsten by supplying the tungsten film forming gas into the reaction container.

According to another embodiment of the present disclosure, a non-transitory computer-readable storage medium storing a program used for a film forming apparatus for performing the aforementioned method is provided.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
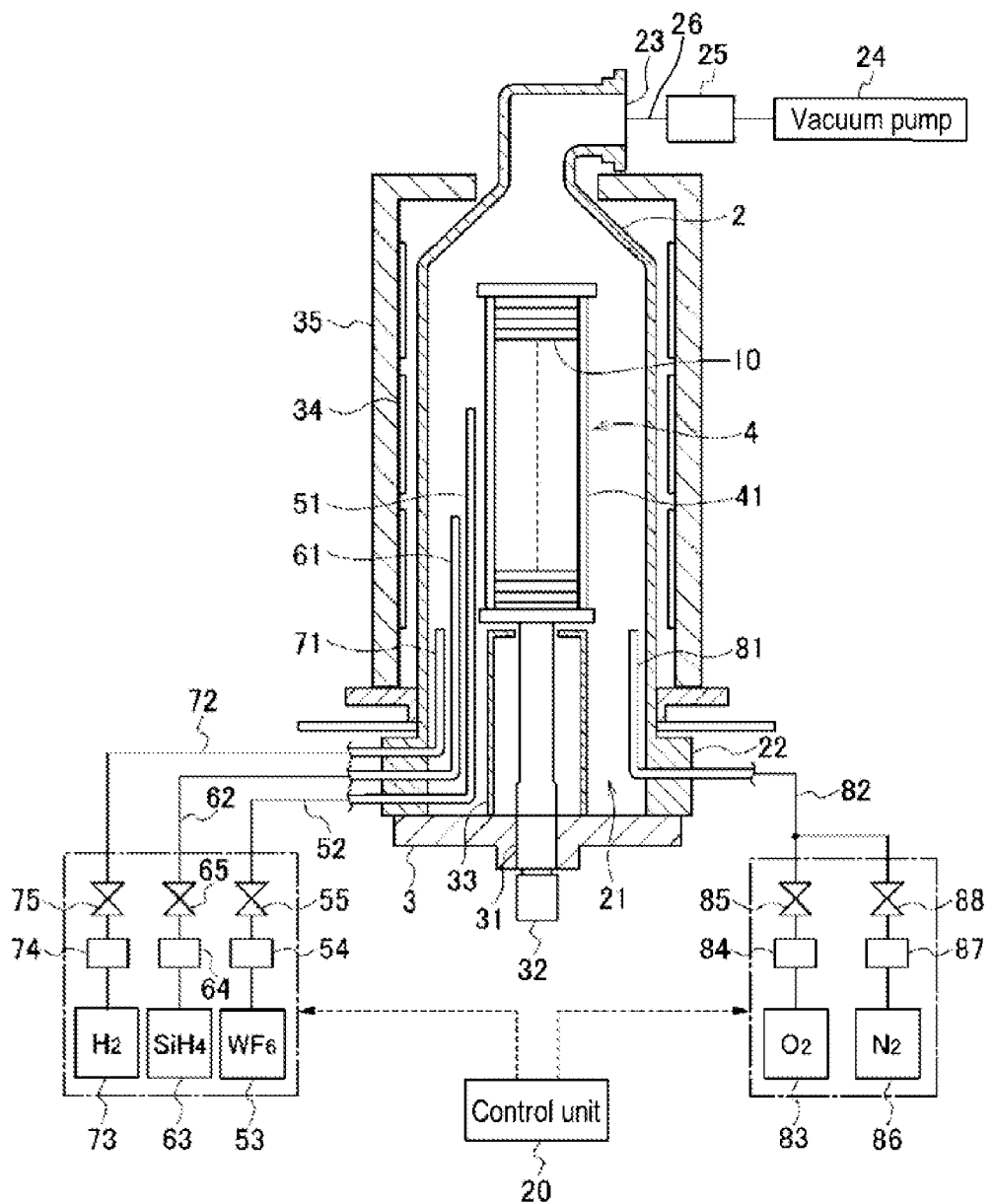
FIG. 1 is a longitudinal cross-sectional view of a film forming apparatus for performing a stacked film forming process according to the present disclosure.

FIG. 1 is a longitudinal cross-sectional side view schematically showing a film forming apparatus. In FIG. 1, reference numeral 2 denotes a vertical cylindrical reaction container made of, e.g., quartz. The bottom of the reaction container 2 is opened to form an opening 21 as a furnace opening having its periphery integrated with a flange 22. A lid 3 made of, for example, quartz for air-tightly blocking the opening 21 when contacting a bottom of the flange 22 is provided under the reaction container 2. The lid 3 is vertically moved by a boat elevator (not shown) to open/close the opening 21. A rotary shaft 31 is provided so as to penetrate a middle portion of the lid 3, and a wafer boat 4 as a substrate holder is mounted on an upper end of the rotary shaft 31.

The wafer boat 4 includes three or more (for example, four) support pillars 41. Grooves (slots) are formed in the support pillars 41 so as to hold a plurality of (for example, 125) semiconductor wafers (hereinafter abbreviated as wafers) 10 as workpieces in a shelf-like form. A motor 32 constituting a driving part to rotate the rotary shaft 31 is provided in a lower part of the rotary shaft 31. Accordingly, the wafer boat 4 is rotated by the motor 32. In addition, a heat insulating unit 33 surrounding the rotary shaft 31 is provided on the lid 3.

L-shaped injectors 51, 61, 71 and 81 for supplying gases onto the wafers 10 in the reaction container 2 are inserted into the flange 22 of the reaction container 2. A gas supply pipe 52 as a gas supply path is connected to a base end of the injector 51. A base end side of the gas supply pipe 52 includes a supply source 53 of $WF_6$ gas as a gas for forming a W film, a mass flow controller 54 as a flow rate controller, and a valve 55 in this order from an upstream side.

A gas supply pipe 62 as a gas supply path is connected to a base end of the injector 61. A base end side of the gas supply pipe 62 includes a supply source 63 of $SiH_4$ gas as a gas for forming a silicon film, a mass flow controller 64, and a valve 65 in this order from an upstream side. A gas supply pipe 72 as a gas supply path is connected to a base end of the injector 71. A base end side of the gas supply pipe 72 includes a supply source 73 of hydrogen ($H_2$) gas, a mass flow controller 74, and a valve 75 in this order from an upstream side. The injector 71, the gas supply pipe 72, the supply source 73 of $H_2$ (hydrogen) gas, the mass flow controller 74 and the valve 75 are used in a modification which will be described later.

A gas supply path 82 is connected to a base end of the injector 81. The gas supply path 82 is divided into two lines in this example. One of the lines includes a supply source 83 of oxygen ($O_2$) gas as a gas for forming a reaction blocking layer, a mass flow controller 84, and a valve in this order from an upstream side, and the other line includes a supply source 86 of nitrogen ($N_2$) gas, a mass flow controller 87, and a valve 88 in this order from an upstream side. The injectors, the supply sources, the mass flow controllers, the valves, and the gas supply paths constitute a gas supply unit.

In addition, an exhaust port 23 for exhausting an interior of the reaction container 2 is formed in an upper part of the reaction container 2. An exhaust pipe 26 is connected to the exhaust port 23. The exhaust pipe 26 includes: a vacuum pump 24 having the ability to depressurize the interior of the reaction container 2 to a desired degree of vacuum and exhaust the interior of the reaction chamber 2; and a pressure adjusting part 25 is connected to the exhaust port 23. A heating furnace 35 including a heater 34 as a heating means for heating the inside of the reaction container 2 is provided around the reaction container 2.

Further, a control unit 20 including a computer is included in the film forming apparatus. The control unit 20 starts up process programs, reads process recipes stored in a memory (not shown), controls process conditions based on the read recipes, and outputs control signals for controlling the heater 34, the pressure adjusting part 25 and gas supply devices (valves, mass flow controllers and so on) of the gas supply unit respectively. Software including the process programs and process recipes (including screen data for an input of the process recipes) is stored in a storage medium such as a flexible disk, compact disk, or magneto-optical (MO) disk and is installed in the control unit 20.

Figure 2:
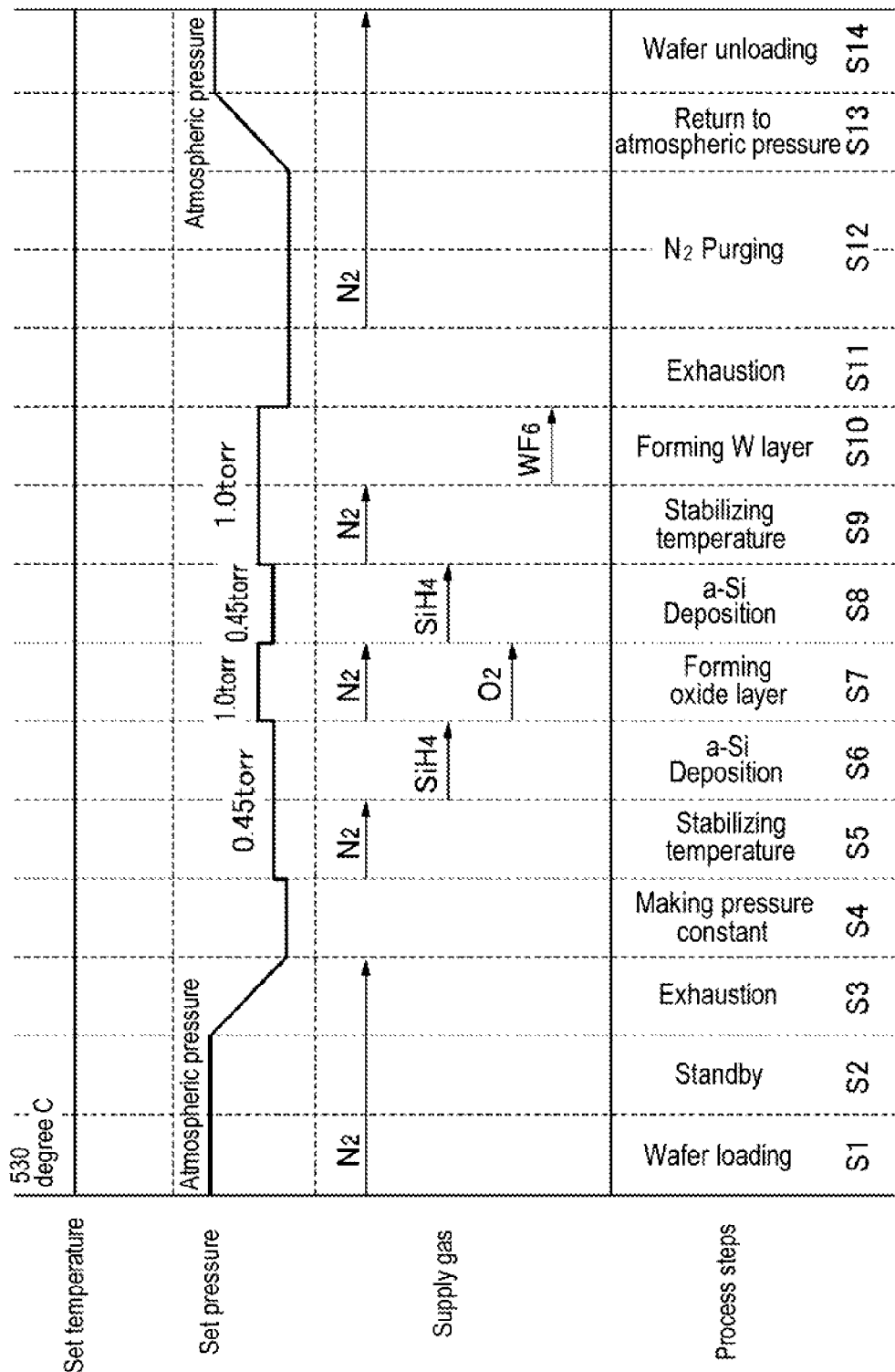
FIG. 2 is a timing chart showing processes in the film forming apparatus.

Next, one example of a mask structure forming method carried out by the above-described film forming apparatus will be described with reference to FIG. 2 and longitudinal cross-sectional views of films of a wafer 10 shown in FIGS. 3 to 8. FIG. 2 is a process diagram of processes performed by the film forming apparatus, showing a relationship between a profile of temperature and pressure set in the reaction container 2 and timings at which gases are supplied into the reaction container 2.

Figure 3:
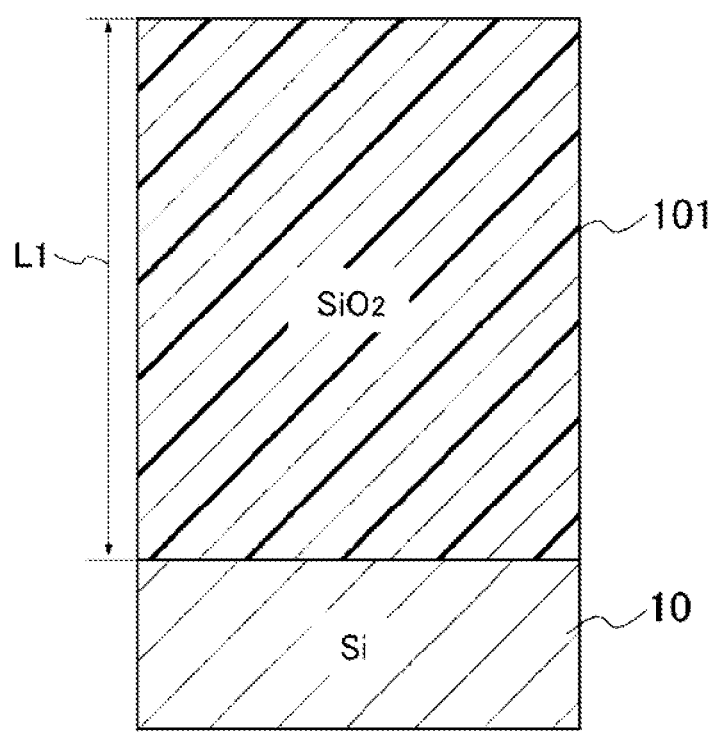
FIG. 3 is a longitudinal cross-sectional view of films of a wafer processed in the film forming apparatus.

A predetermined number of the wafers 10 formed of Si are mounted in a shelf-like form on the wafer boat 4. As shown in FIG. 3, a silicon oxide film ($SiO_2$) 101 as an insulating film mainly containing Si and O is formed on a surface of each of the wafers 10. The thickness L1 of the $SiO_2$ film 101 is, for example, 1 μm. An internal temperature of the reaction container 2 is controlled to be, for example, 530 degrees C. and an internal pressure of the reaction container 2 is controlled to be the atmospheric pressure by supplying $N_2$ gas into the reaction container 2. In this example, the temperature set in the reaction container 2 is maintained at 530 degrees C. during the processing of the wafer W. When the boat elevator (not shown) is moved up, the wafer boat 4 is loaded into the reaction container 2 (Step S1).

After the bottom opening of the flange 22 is blocked by the lid 3 to enter a standby state (Step S2), the internal pressure of the reaction container 2 is lowered by the pressure adjusting part 25 of the apparatus (Step S3). Thereafter, the supply of the $N_2$ gas into the reaction container 2 is stopped and the internal pressure of the reaction container 2 is maintained at a predetermined pressure by the pressure adjusting part 25 (Step S4). Thereafter, the $N_2$ gas is supplied into the reaction container 2 to increase the internal pressure of the reaction container 2 to, for example, 60 Pa (0.45 Torr), and the internal temperature of the reaction container 2 is stabilized (Step S5).

Figure 4:
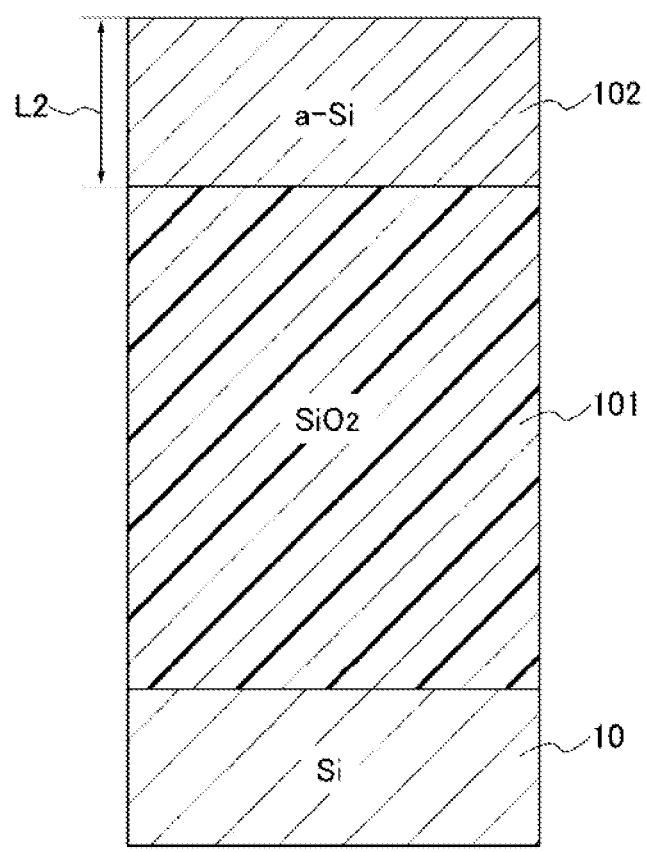
FIG. 4 is a longitudinal cross-sectional view of films of a wafer processed in the film forming apparatus.

Subsequently, the supply of the N2 gas into the reaction container 2 is stopped and an $SiH_4$ gas begins to be supplied into the reaction container 2 (Step S6). An amorphous silicon (a-Si) film 102 is deposited on the $SiO_2$ film 101 by the $SiO_4$ gas (FIG. 4). The a-Si film 102 acts as a mask when the SiO2 film 101 is etched along with a W film 105 which is will be described later. To serve as the mask, the a-Si film 102 is formed to have a thickness L2 of, for example, 300 nm or more. In addition, the a-Si film 102 is higher in adhesion to the W film 105 than the $SiO_2$ film 101 and accordingly serves as an adhesion layer to adhere the W film 105 to the $SiO_2$ film 101. In this manner, the film formed on the $SiO_2$ film 101 is capable of serving as the adhesion layer and has a reaction blocking layer formed thereon through oxidization or nitridation of its surface layer as described below. However, since the a-Si film 102 can serve as the adhesion layer even when L2 is about 5 nm, the a-Si film 102 may have a thickness of 5 nm or more. For example, if L2 is 20 nm or less, it is difficult to form the film using the $SiH_4$ gas. For this reason, the film is formed by setting the interior temperature of the reaction container 2 to about 400 degrees C. and performing CVD using $Si_2H_6$ (disilane) gas instead of $SiH_4$ gas. When the $Si_2H_6$ gas is used, the a-Si film 102 may be directly formed on the $SiO_2$ film 101, or alternatively, a seed layer may be formed using aminosilane and then the a-Si film 102 may be formed on the seed layer.

Figure 5:
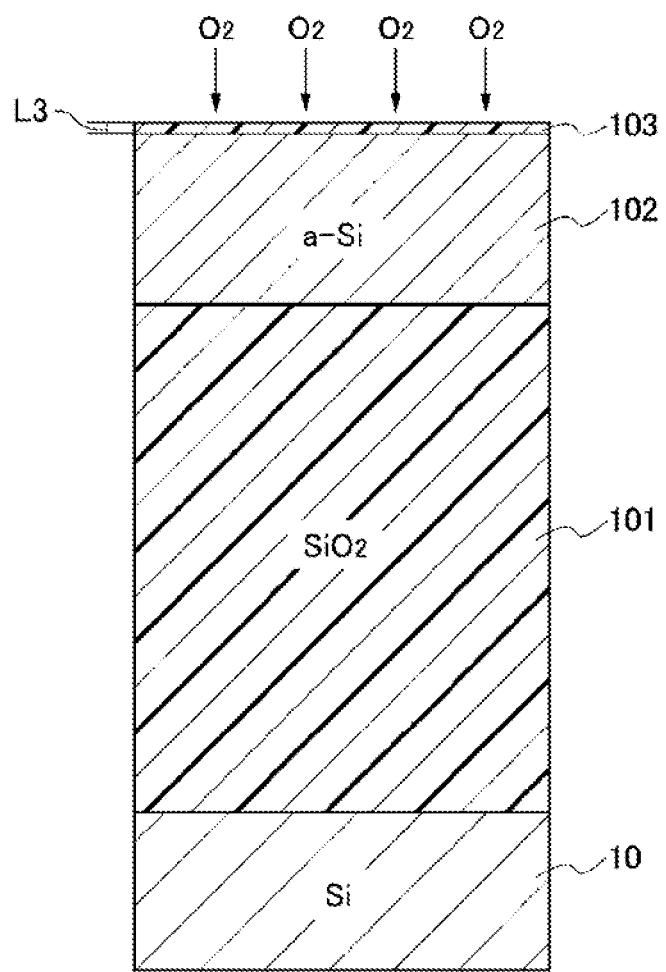
FIG. 5 is a longitudinal cross-sectional view of films of a wafer processed in the film forming apparatus.

Once the a-Si film 102 is formed to have a desired thickness, the supply of the $SiH_4$ gas into the reaction container 2 is stopped and the $SiH_4$ gas is exhausted and removed from the reaction container 2. Thereafter, a mixture gas of $N_2$ gas and $O_2$ gas is supplied into the reaction container 2 and the internal pressure of the reaction container 2 is set to, for example, 133 Pa (1.0 Torr). The surface of the a-Si film 102 is oxidized by the $O_2$ gas in the mixture gas to form a reaction blocking layer 103 as an oxidizing layer as shown in FIG. 5 (Step S7). The reaction blocking layer 103 serves to block a reaction of the underlying a-Si film 102 and the $WF_6$ gas in forming the W film 105 as described later. For this purpose, a thickness L3 of the reaction blocking layer 103 may be, for example, 0.6 nm to 1.0 nm (0.8 nm to 0.9 nm in this example).

Figure 6:
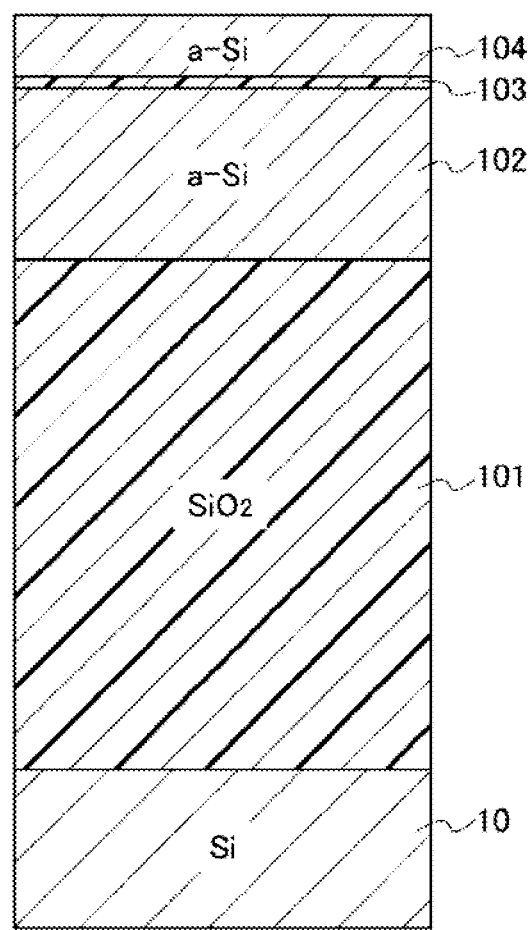
FIG. 6 is a longitudinal cross-sectional view of films of a wafer processed in the film forming apparatus.

Thereafter, the supply of the mixture gas into the reaction container 2 is stopped, and the mixture gas is exhausted and removed from the reaction container 2. Then, the $SiH_4$ gas is again supplied into the reaction container 2 (Step S8), and the internal pressure of the reaction container 2 is controlled to be, for example, 60 Pa (0.45 Torr). Then, an a-Si film 104 is formed on the reaction blocking layer 103, as shown in FIG. 6. Since the W film 105 is formed from the a-Si film 104 as will be described later, a thickness of the a-Si film 104 is set based on a desired thickness of the W film 105.

Once the a-Si film 104 is formed, the supply of the $SiH_4$ gas into the reaction container 2 is stopped, and the $SiH_4$ gas is exhausted and removed from the reaction container 2. Subsequently, $N_2$ gas is supplied into the reaction container 2, and the internal pressure of the reaction container 2 is controlled to be 133 Pa (1.0 Torr). The $N_2$ gas continues to be supplied, and the internal temperature of the reaction container 2 is stabilized (Step S9).

Figure 7:
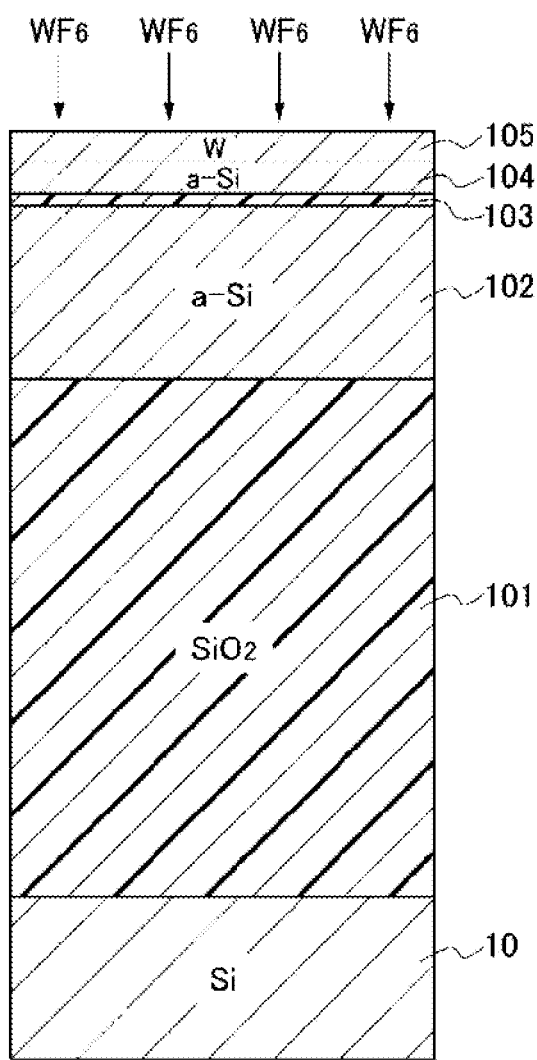
FIG. 7 is a longitudinal cross-sectional view of films of a wafer processed in the film forming apparatus.

Subsequently, the supply of the $N_2$ gas into the reaction container 2 is supplied, and $WF_6$ gas is supplied into the reaction container 2 (Step S10). The $WF_6$ gas reacts with the a-Si film 104 according to the following Equation 1, replacing the a-Si film 104 with the W film 105 (FIG. 7).

$$3Si+2WF_6 \rightarrow W+3SiF_4 \qquad \text{(Equation 1)}$$

Figure 8:
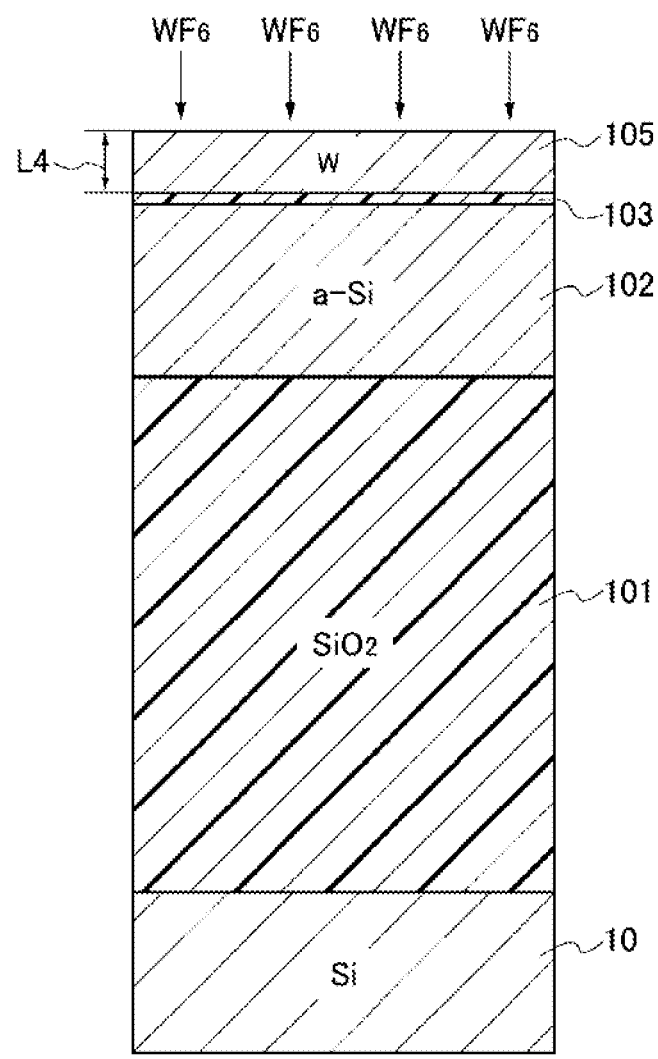
FIG. 8 is a longitudinal cross-sectional view of films of a wafer processed in the film forming apparatus.

When the a-Si film 104 is replaced with the W film 105 down to a lower layer of the a-Si film 104 as the replacement proceeds from an upper layer to the lower layer of the a-Si film 104, the reaction of the equation 1 is stopped by the reaction blocking layer 103. In other words, since the a-Si film 102 is prevented from contacting the $WF_6$ gas by the reaction blocking layer 103, the a-Si film 102 can be prevented from being replaced with the W film 105 even when the $WF_6$ gas continues to be supplied (FIG. 8). The W film 105 thus formed may have a relatively large film stress, and accordingly a thickness L4 of the W film 105 may be set to 100 nm or less (50 nm in this example) in order to prevent peeling-off and distortion of the film due to the film stress. In addition, since the W film 105 formed by supplying the $WF_6$ gas after forming the a-Si film 104 contains Si, the W film 105 may be referred to as a film mainly containing W. Herein, for the sake of convenience, a film formed by supplying a process gas containing a tungsten compound to a silicon film and replacing silicon of the silicon film with tungsten is referred to as a W film.

Thereafter, the supply of the $WF_6$ gas into the reaction container 2 is stopped, and the WF6 gas is exhausted and removed from the reaction container 2 (Step S11). Subsequently, $N_2$ gas is supplied into the reaction container 2 (Step S12). With the supply of the $N_2$ gas, the internal pressure of the reaction container 2 is increased by the pressure adjusting part 25 (Step S13). When the internal pressure reaches atmospheric pressure, the boat elevator is moved down and the wafer boat 4 is unloaded from the reaction container 2 (Step S14).

Figure 9:
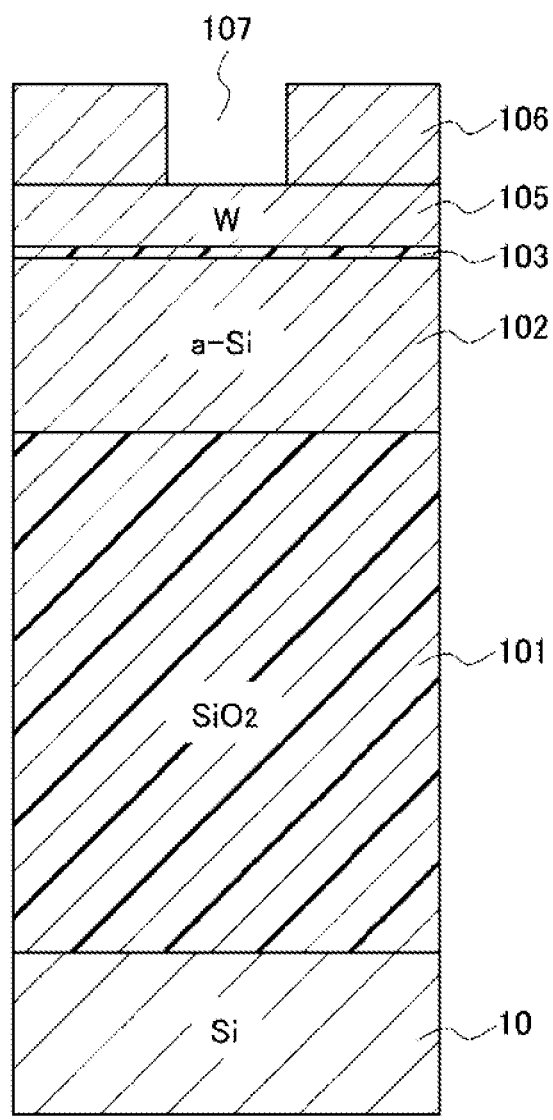
FIG. 9 is a longitudinal cross-sectional view of films of a wafer after the film formation.
Figure 10:
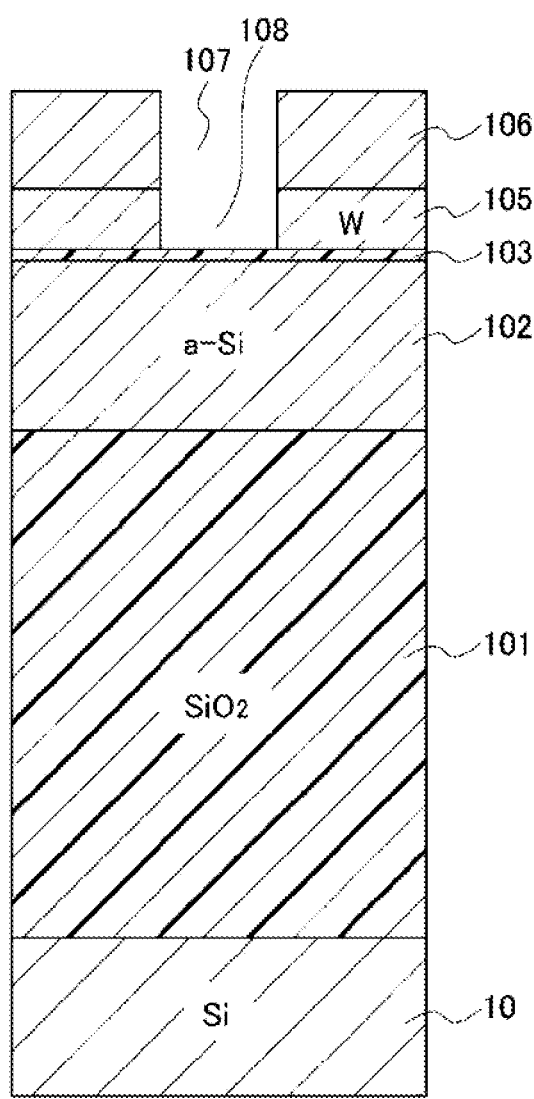
FIG. 10 is a longitudinal cross-sectional view of films of a wafer etched after the film formation.

A process subsequently performed for the wafer 10 will be described below. A resist film 106 is formed on the W film 105. The resist film 106 is opened to form a pattern 107 (FIG. 9). The W film 105 is etched along the pattern 107. Accordingly, a pattern 108 is formed in the W film 105 (FIG. 10). An example of a gas used to etch the W film 105 may include a chlorine ($Cl_2$) gas or a carbon tetrafluoride ($CF_4$) gas.

Figure 11:
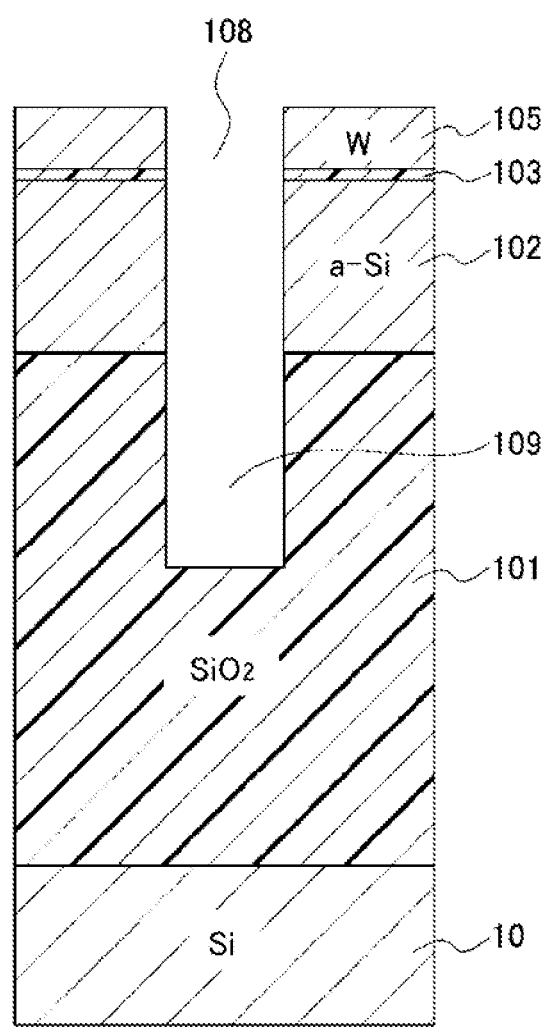
FIG. 11 is a longitudinal cross-sectional view of films of a wafer etched after the film formation.

Thereafter, the resist film 106 is removed, and the a-Si film 102 and the $SiO_2$ film 101 are etched along the pattern 108 to form a concave portion 109 in the $SiO_2$ film 101 (FIG. 11). An example of a gas used to etch the $SiO_2$ film 101 may include a fluorine-based gas such as hexafluorobutadiene ($C_4F_6$) or octafluorobutene ($C_4F_8$).

Figure 12:
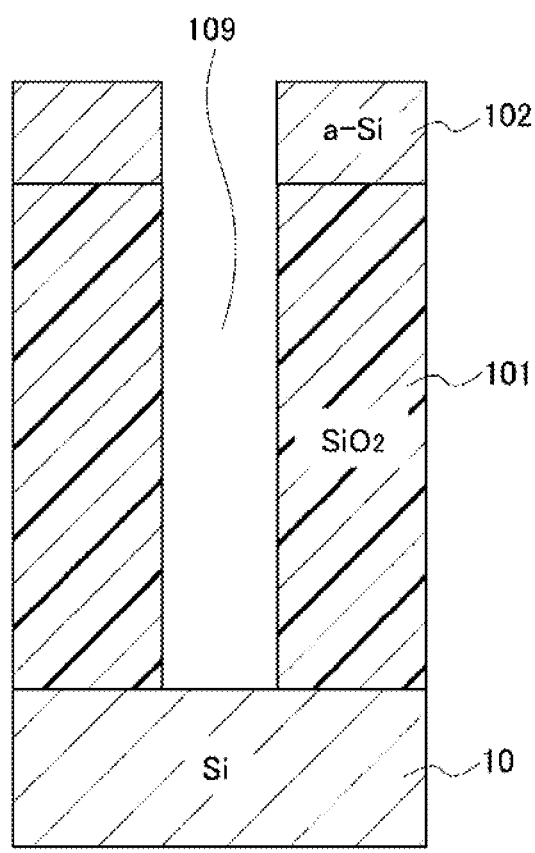
FIG. 12 is a longitudinal cross-sectional view of films of a wafer etched after the film formation.

When the $SiO_2$ gas 101 is etched using the etching gas, the $SiO_2$ film 101 is higher in etching selectivity than the W film 105. In other words, an etching rate at which the W film 105 is etched is lower than the etching rate at which the $SiO_2$ film is etched. In other words, the W film 105 serves as an etching mask for the $SiO_2$ film 101. Further, when the etching gas is used, the SiO2 film 101 is higher in etching selectivity than the a-Si film 102. Accordingly, when the W film 105 is etched away in the course of forming the concave portion 109, the $SiO_2$ film 101 continues to be etched using the a-Si film 102 as a mask, as described above (FIG. 12). The concave portion 109 thus formed is filled with, for example a capacitor constituting a DRAM.

With the above-described mask structure forming method, the a-Si film 102 is formed to adhere the W film 105 onto the $SiO_2$ film 101, and the surface layer of the a-Si film 102 is oxidized and serves as the reaction blocking layer 103 to prevent the a-Si film 102 from reacting with the $WF_6$ gas. In addition, the a-Si film 104 formed on the reaction blocking layer 103 is replaced with the W film 105. This can prevent the a-Si film 102 from being replaced with the W film 105, thereby preventing the W film 105 from being peeled off. In addition, since the a-Si film 102 is prevented from being replaced with the W film 105, the thickness of the W film 105 is determined depending on the thickness of the a-Si film 102. Accordingly, the thickness of the W film 105 can be controlled with high precision.

Further, reactivity between the $WF_6$ gas and $SiH_4$ is relatively high. Even when concentration or flow rate of the $WF_6$ gas at each part in the reaction container 2 become non-uniform and there occurs a deviation in level of reaction among various parts in the plane of the wafer 10 and among wafers 10 depending on the level of reactivity, reaction below the reaction blocking layer 103 is blocked, as described above. Thus, the thickness of the W film 105 can be controlled with high precision in the plane of the wafer 10 and among wafers 10. In other words, when a number of wafers 10 are processed collectively, the method according to this embodiment can perform the process with high uniformity among various parts in the plane of the wafer 10 and among wafers 10, thereby improving a throughput and preventing a decrease in yield.

As described in the above "Background" section, the W film may be formed using a TiN film as an adhesion layer. However, even when the TiN film is used as the adhesion layer, the thickness of the W film is limited depending on its film stress, as in the formation of the W film 105 according to this embodiment. In other words, apart from the TiN film, a film such as an a-Si film needs to be formed, as a mask used for etching an $SiO_2$ film, below the W film. However, such formation of the film as the mask further complicates the process. On the contrary, with the method according to this embodiment, since the a-Si film 102 serves as not only the adhesion layer but also the etching mask of the $SiO_2$ film 101, the number of kinds of films formed on the wafer 10 until the W film is formed can be limited, thus preventing the process from being complicated.

When the a-Si film 104 of Step S8 is formed by supplying $Si_2H_6$ gas onto the wafer 10, as a modification, H2 gas is supplied into the reaction container 2 before the $N_2$ gas is supplied in Step S9 after the $Si_2H_6$ gas is exhausted. The internal pressure of the reaction container 2 at the time of supply of the $H_2$ gas is, for example, 800 Pa (6.0 Torr). The $H_2$ gas is supplied to decrease the set internal temperature of the reaction container 2 to a temperature lower than 530 degrees C., and the subsequent steps S are performed at the decreased temperature. Such decrease in temperature can prevent migration of the a-Si film 104 formed using the $Si_2H_6$ gas, thereby suppressing a film stress of the W film 105 and preventing deformation and peeling-off of the W film 105. In order to prevent progress of the reaction indicated in Equation 1 from becoming difficult due to such decrease in temperature, $H_2$ gas is not supplied in the example of forming the a-Si film 104 using the $SiH_4$ gas.

A polysilicon film may be formed instead of the a-Si films 102 and 104. However, in order to form such a polysilicon film, there is a need to increase the set internal temperature of the reaction container 2 rather than form the a-Si films 102 and 104. In other words, in the first embodiment where the a-Si films 102 and 104 are formed, since an increase in the internal temperature of the reaction container 2 is suppressed before the W film 105 is formed, the time taken to decrease the internal temperature of the reaction container 2 to the set temperature in Step S9 can be shortened. Accordingly, in the first embodiment, reduction in throughput can be more reliably suppressed.

In the first embodiment, since the processes from formation of the a-Si film 102 to formation of the W film 105 are performed while the wafers 10 are stored in the reaction container 2, the throughput can be improved. However, for example, the processes may be performed in an apparatus external to the reaction container 2 until the reaction blocking layer 103 is formed, and thereafter, the wafers 10 may be loaded into the reaction container 2, and the processes may be performed without unloading the wafers 10 from the reaction container 2 until the W film 105 is formed. Until the W film 105 is formed after the a-Si film 104 is formed, in order to prevent formation of the W film 105 from being obstructed due to oxidation of the surface layer of the a-Si film 104 by oxygen contained in the external atmosphere of the reaction container 2, it is effective not to unload the wafers 10 from the reaction container 2.

Second Embodiment

Figure 13:
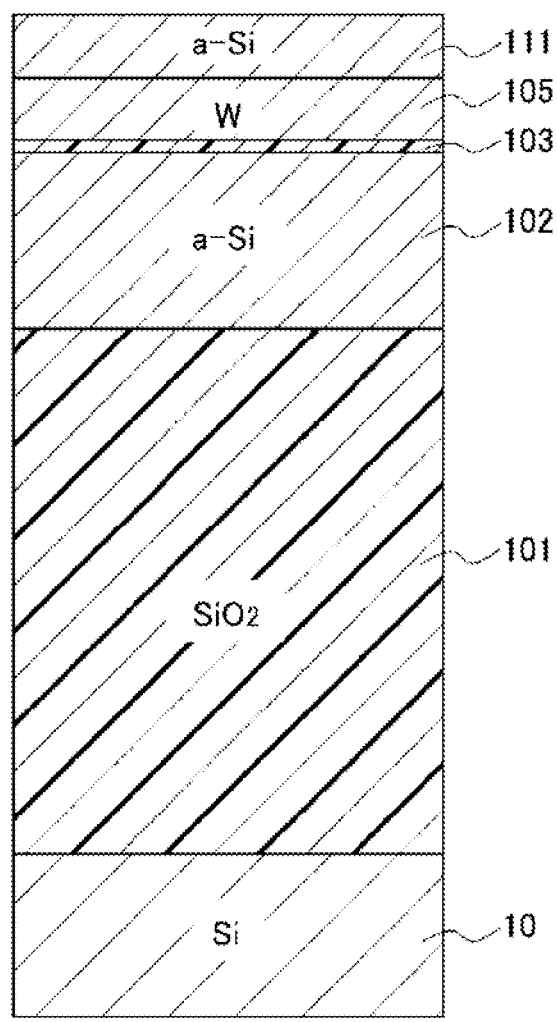
FIG. 13 is a longitudinal cross-sectional view of films of a wafer processed in the film forming apparatus.

Subsequently, a mask structure forming method according to a second embodiment will be described. In the second embodiment, the film forming apparatus described in the first embodiment is used to form a stacked W film. For example, the W film 105 is formed on the wafer 10 according to the above-described Steps S1 to S11, and, after the $WF_6$ gas is removed from the reaction container 2, $SiH_4$ gas is supplied into the reaction container 2 to form an a-Si film 111 on the W film 105, as in Step S8 (FIG. 13).

Thereafter, the Steps S9 and S10 are performed to exhaust the $SiH_4$ gas and supply $WF_6$ gas into the reaction container 2. The $WF_6$ gas reacts with the a-Si film 111 to replace the a-Si film 111 with a W film 112, which is stacked on the W film

Figure 14:
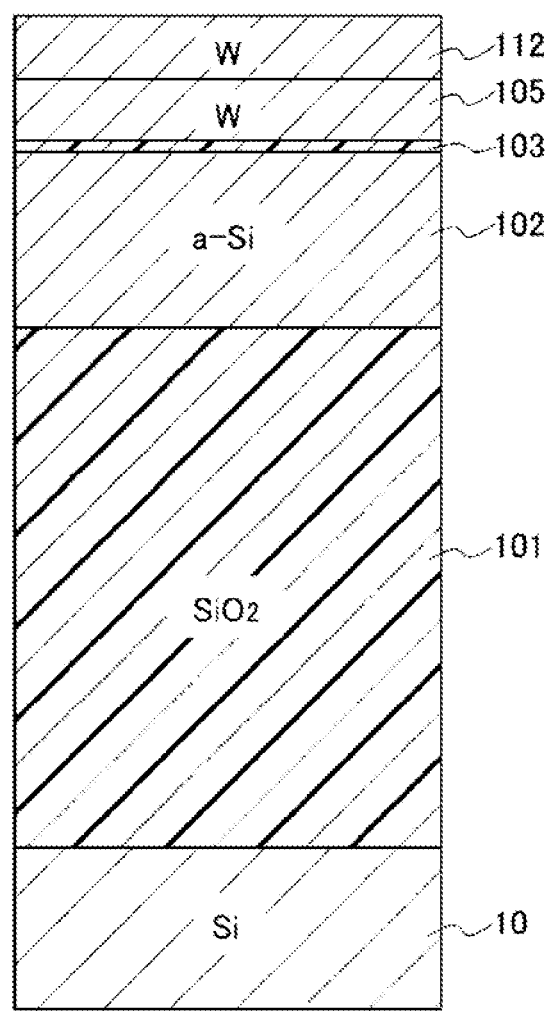
FIG. 14 is a longitudinal cross-sectional view of films of a wafer processed in the film forming apparatus.
Figure 15:
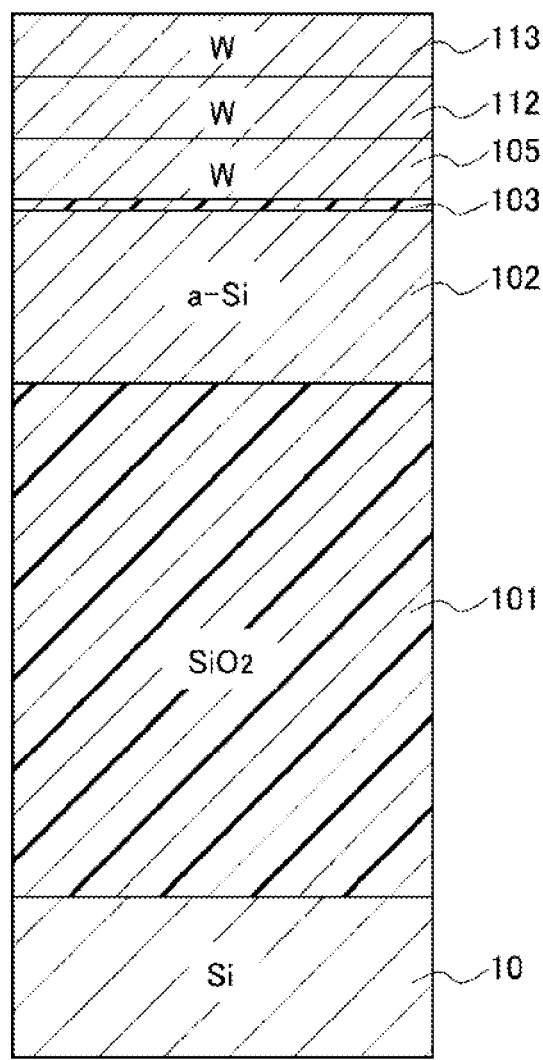
FIG. 15 is a longitudinal cross-sectional view of films of a wafer processed in the film forming apparatus.

105 (FIG. 14). The supply of the SiH$_4$ gas and the supply of the WF$_6$ gas into the reaction container 2 may be repeated to form a three-layer stacked W film 113 as shown in FIG. 15. The number of stacked layers of the W film may be four or more. If the thickness per one layer of the W film is increased, W grains grow during the formation of the film, increasing the film stress of the W film. However, a total thickness of respective layers of the W film may be increased by increasing the number of stacked layers, while suppressing growth of the W grains in each layer by stacking W films, each of which has a relatively small thickness, to prevent the film stress from increasing. For example, according to this method, the W film may be formed to have a total thickness of respective layers of 150 nm or more. When the thickness per one layer of the W film is, for example, 50 nm, the number of stacked layers is four in order to set the total thickness of the W film to, for example, 200 nm.

In addition, when the a-Si film 111 is replaced with the W film 112, the Si concentration tends to increase from the surface of the film toward the bottom of the film. For this reason, the a-Si film 111 having a smaller thickness is better than the a-Si film 111 having a larger thickness in terms of the uniformity of Si (or W) concentration in a depth-direction of the film. Accordingly, in order to provide better uniformity of the W concentration in the depth-direction of the film, layers of the W film may be stacked sequentially by repeating formation of an a-Si film 111 having a smaller thickness and supply of the WF$_6$ gas, rather than forming an a-Si film 111 having a larger thickness and replacing the a-Si film 111 with a W film one at a time. Thereafter, the W film 112 serves as a mask of the SiO$_2$ film 101 through an etching process. By using the W film having a good uniformity of the W concentration, management in the etching process is facilitated, providing smooth etching.

Third Embodiment

Figure 16:
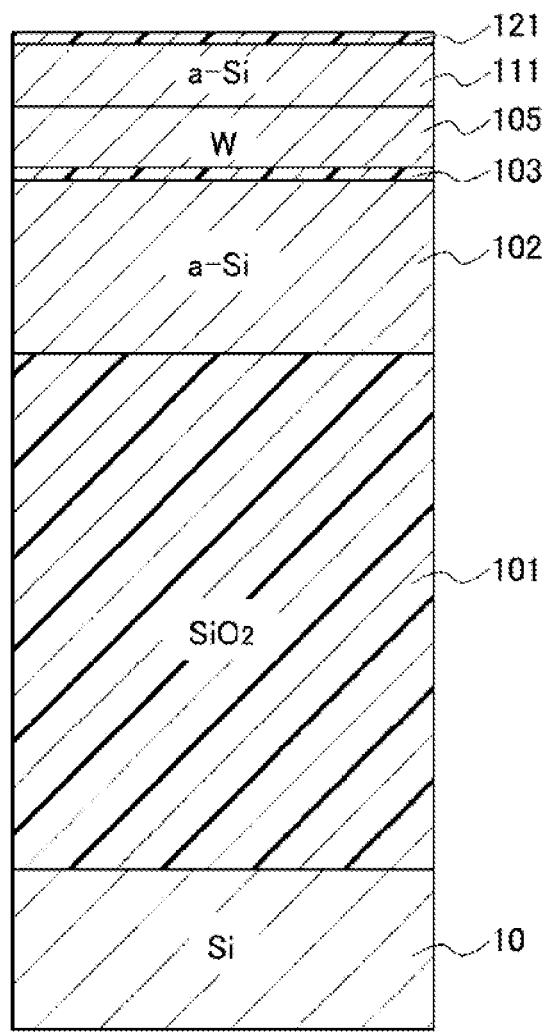
FIG. 16 is a longitudinal cross-sectional view of films of a wafer processed in the film forming apparatus.
Figure 17:
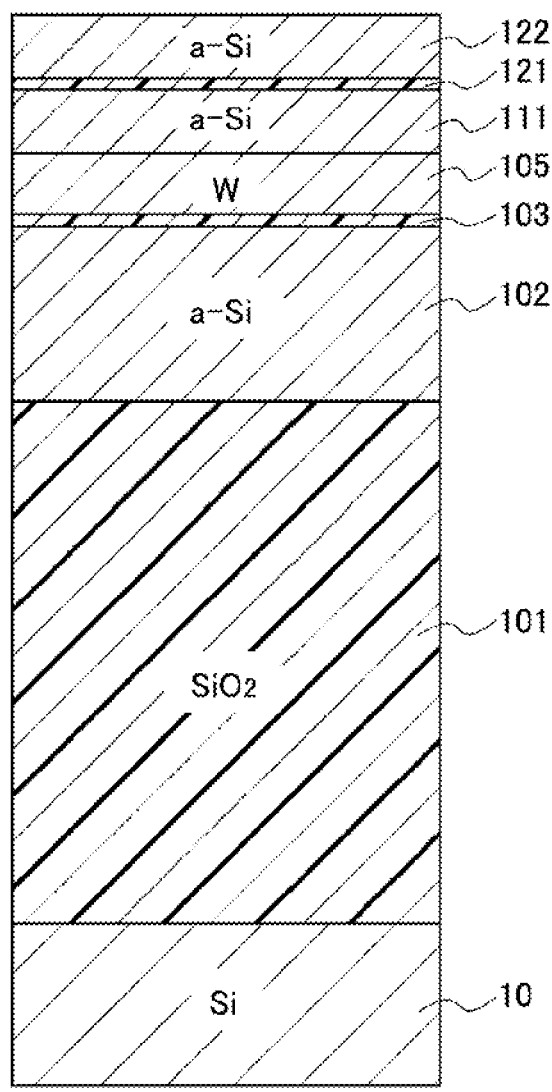
FIG. 17 is a longitudinal cross-sectional view of films of a wafer processed in the film forming apparatus.
Figure 18:
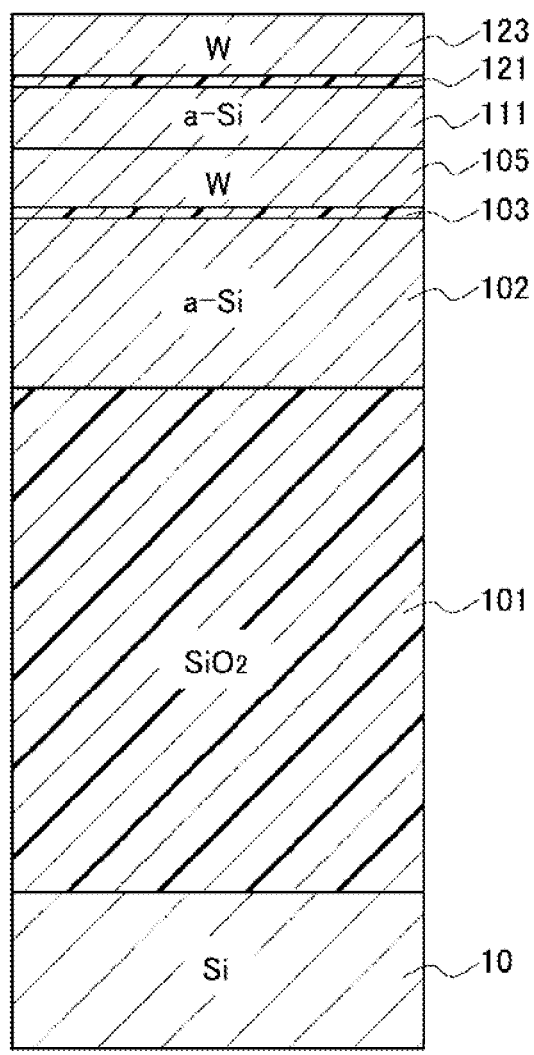
FIG. 18 is a longitudinal cross-sectional view of films of a wafer processed in the film forming apparatus.

Next, a mask structure forming method according to a third embodiment which is performed using the above-described film forming apparatus will be described. In the third embodiment, the film forming apparatus described in the first embodiment is used as well. In the third embodiment, a stacked film including a plurality of reaction blocking layers and a plurality of W films is formed. As shown in FIG. 13, after the a-Si film 111 is formed on the W film 105, according to the Step S7, O$_2$ gas is supplied to oxidize the surface layer of the a-Si film 111, forming a reaction blocking layer 121 (FIG. 16). Thereafter, processes are performed according to Steps S8 to S11. In other words, SiH$_4$ gas is supplied into the reaction container 2 to form an a-Si film 122 on the reaction blocking layer 121 (FIG. 17), and then WF$_6$ gas is supplied into the reaction container 2 to form a W film 123 from the a-Si film 122 (FIG. 18). The formation of the a-Si film 111 on the W film and Steps S8 to S11 may be further repeated to form a stacked layer including three or more layers of the reaction blocking layer and three or more layers of the W film.

The formation of the stacked film described in the second and third embodiments can achieve the same effects as those achieved by the formation of the stacked layer described in the first embodiment. As described in the second and third embodiments, the W film may have a plurality of layers.

Although, in the above embodiments, the reaction blocking layer is formed by oxidizing the surface layer of the a-Si film which is the adhesion layer, the reaction blocking layer may be formed by nitriding the surface layer of the a-Si film. An example of a gas used for the nitridation may include ammonia (NH$_3$), nitrogen monoxide (NO), dinitrogen monoxide (N$_2$O) or the like. In a case where the polysilicon film is used as the adhesion layer instead of the a-Si film, the reaction blocking layer may be formed by oxidizing or nitriding the surface layer of the polysilicon film as well. In addition, a gas used to form the W film is not limited to the WF$_6$ gas but may be, for example, a tungsten hexachloride (WCl$_6$) gas.

Further, a film to be etched using the W film as a mask is not limited to the SiO$_2$ film but may be any film mainly containing Si and O, for example an SiCOH film or an SiOC film.

Further, dopants may be implanted when forming the a-Si film. By implanting the dopants when forming the a-Si film, the dopants are distributed in the W film to be formed, thereby improving an etching resistance of the W film. Examples of materials implanted as the dopants may include oxygen (O), carbon (C), nitrogen (N), boron (B), phosphorus (P), germanium (Ge) or the like. Examples of materials used to implant the above-mention elements are as follows.

O: N$_2$O, NO
C: C$_x$H$_y$, such as C$_2$H$_4$
N: NH$_3$
B: Boron trichloride (BCl$_3$), Diborane (B$_2$H$_6$)
P: Phosphine (PH$_3$)
Ge: hydrogen germanium (GeH$_4$)

These materials may be implanted alone or in combination.

Evaluation Test 1

Figure 19:
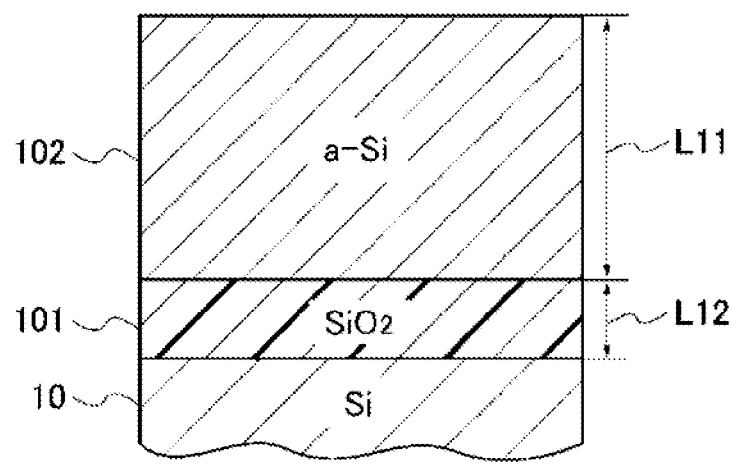
FIG. 19 is a longitudinal cross-sectional view of films formed on a wafer in an evaluation test.
Figure 20:
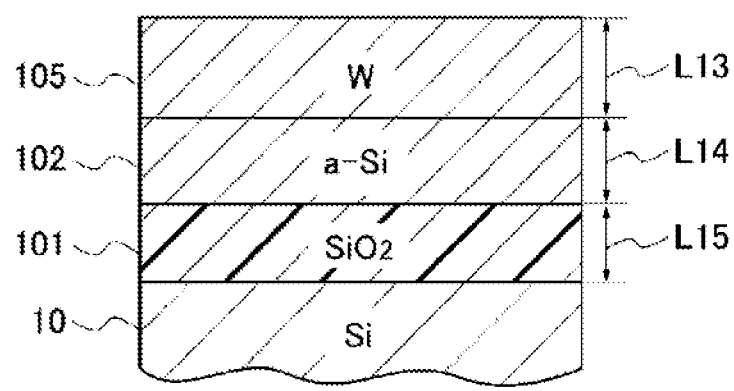
FIG. 20 is a longitudinal cross-sectional view of films formed on a wafer in an evaluation test.
Figure 21:
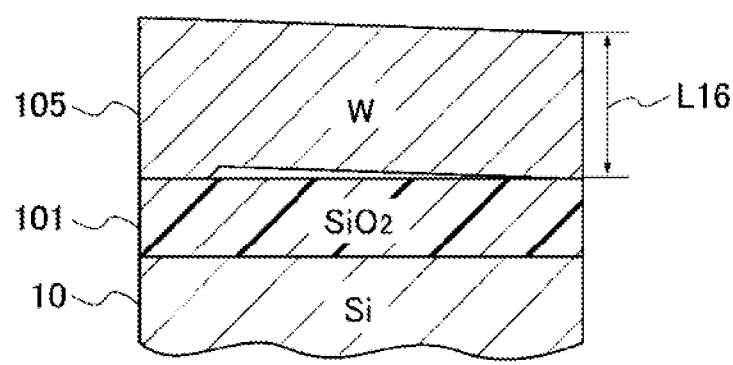
FIG. 21 is a longitudinal cross-sectional view of films formed on a wafer in an evaluation test.

An evaluation test performed in relation to the present disclosure will be described below. After forming the a-Si film 102 on the wafer 10 on which the SiO$_2$ film 101 was formed, WF$_6$ gas was supplied to form a W film 105 from the a-Si film 102. In other words, in this evaluation test 1, the reaction blocking layer 103 and the a-Si film 104 are not formed, unlike the above-described embodiments. Longitudinal cross-sections of various parts in the plane of the wafer 10 were observed after the formation of the W film 105. FIGS. 19 to 21 schematically show such longitudinal cross-sectional views.

Depending on the observed parts, a large deviation was observed in the formation state of the W film 105. Specifically, a part where the W film 105 was not formed (see FIG. 19), a part where an upper layer of the a-Si film 102 was replaced with the W film 105 and the unreacted a-Si film 102 remained under the W film 105 (see FIG. 20), and a part where the a-Si film 102 was replaced with the W film 105 from an upper layer to a lower layer of the a-Si film 102 and the a-Si film 102 was covered (see FIG. 21) were observed. It was observed that the W film 105 floats on the SiO$_2$ film without adhering to the SiO$_2$ film 101 in the part where the a-Si film 102 is replaced with the W film 105 down to the lower layer of the a-Si film 102. FIG. 21 shows the W film 105 floating on the SiO$_2$ film 101.

Regarding the thickness of each film, in FIG. 19, a thickness L11 of the a-Si film 102 was 362 nm and a thickness L12 of the SiO$_2$ film 101 was 99 nm. In FIG. 20, a thickness L13 of the W film 105 was 130 nm, a thickness L14 of the a-Si film 102 was 142 nm, and a thickness L15 of the SiO$_2$ film 101 was 99 nm. In FIG. 21, a thickness L16 of the W film 105 was 130 nm.

It appears the deviation in the formation state of the W film 105 occurred in the plane of the wafer 10 due to relatively high reactivity of the a-Si film 102 and the WF$_6$ gas as described above. It also appears from results of this evaluation test 1 that it is difficult in the film forming method of the evaluation test 1 to prepare all parts in the plane of the wafer 10 such that these parts have a stacked structure of the SiO$_2$ film 101, the a-Si film 102 and the W film 105 as shown in FIG. 20. In other words, it appears that it is difficult to form the W film 105 and prevent peeling-off of the W film 105 at all parts in the plane of the wafer 10 and in a plurality of wafers 10.

Evaluation Test 2

Like evaluation test 1, after forming the a-Si film 102 on the wafer 10 on which the $SiO_2$ film 101 was formed, $WF_6$ gas was supplied to form a W film 105 from the a-Si film 102. A cross-section of the wafer 10 was observed after the formation of the W film 105. In this test, the a-Si film 102 was formed to have different thicknesses for every process. The thickness of the a-Si film 102 was set to 30 nm in one process and 100 nm in another process.

From the observation, the thickness of the W film 105 of the wafer 10 in which the thickness of the a-Si film 102 was set to 30 nm was 22.3 nm and the thickness of the W film 105 of the wafer 10 in which the thickness of the a-Si film 102 was set to 100 nm was 78.2 nm. In other words, it can be seen that the thickness of the W film 105 is varied depending on the thickness of the a-Si film 102. Therefore, it can be seen from the evaluation test 2 that the above embodiments can control the thickness of the W film based on the thickness of the a-Si film formed on the reaction blocking layer.

Evaluation Test 3

The wafer boat 4 on which a plurality of wafers 10 were mounted was loaded into the reaction container 2, and, like evaluation test 1, after forming the a-Si film 102 on the $SiO_2$ film 101 of each wafer 10, $WF_6$ gas was supplied to form a W film 105 from the a-Si film 102. Cross-sections of wafers 10 mounted on an upper side, a middle portion, and a lower side of a loading area for loading the wafers 10 of the wafer boat 4 thereon were observed.

From the observation, the parts where the a-Si film 102 was replaced with the W film 105 down to the lower layer of the a-Si film 102 appeared in each of the wafers 10. The W films 105 at these parts had substantially the same thickness. Specifically, the thickness of the W film 105 of the wafer 10 disposed in the upper side of the loading area, the thickness of the W film 105 of the wafer 10 disposed in the middle portion of the loading area and the thickness of the W film 105 of the wafer 10 disposed in the lower side of the loading area were 79.6 nm, 79.3 nm and 78.2 nm, respectively. In this manner, it was confirmed that there was peeling-off of the W film 105 from the $SiO_2$ film 101 in the parts where the $SiO_2$ film 101 was replaced with the W film 105 down to the lower layer of the $SiO_2$ film 101. In addition to the parts where the $SiO_2$ film 101 was completely replaced with the W film 105, parts where the a-Si film 102 remained due to insufficient reaction of the a-Si film 102 and the $WF_6$ gas were also confirmed. It also appears from this evaluation test 3 that it is difficult to form the W film 105 and prevent peeling-off of the W film 105 at all parts in the plane of the wafer 10 and in a plurality of wafers 10 without forming the reaction blocking layer as described in the some embodiments.

Evaluation Test 4

According to the first embodiment, the wafer 10 was processed to form the W film 105. A cross-section of the wafer 10 was observed after the formation of the W film 105. In this test, the thicknesses of the a-Si films 102 and 104 formed by the film forming apparatus were set to 150 nm and 100 nm, respectively. Further, separately from the above-described wafer 10, another wafer 10 was processed according to the first embodiment. The other wafer 10 was taken out of the reaction container 2 before forming the W film 105 after forming the a-Si film 104. A cross-section of this another wafer 10 taken out of the reaction container 2 was observed.

Figure 22:
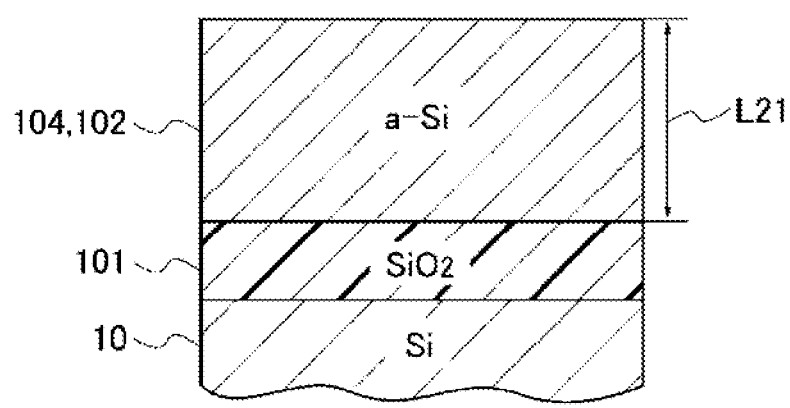
FIG. 22 is a longitudinal cross-sectional view of films formed on a wafer in an evaluation test.
Figure 23:
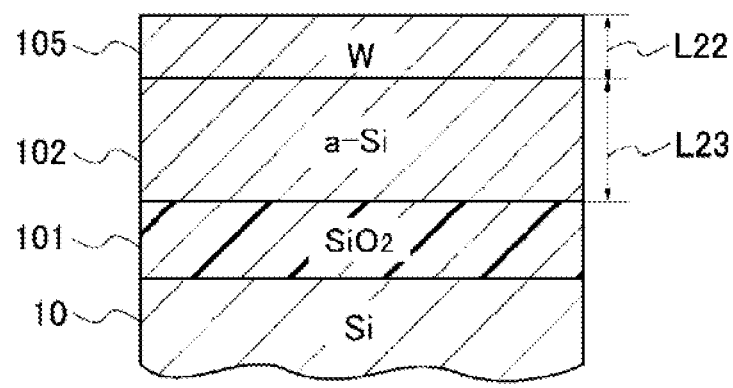
FIG. 23 is a longitudinal cross-sectional view of films formed on a wafer in an evaluation test.

FIG. 22 shows a cross-section of each film of the wafer 10 on which the W film 105 is not formed, and FIG. 23 shows a cross-section of each film of the wafer 10 on which the W film 105 is formed. Since the reaction blocking layer 103 is thin, it is not shown in each of the figures, but is included in the a-Si film 102. In FIG. 22, the total thickness L21 of the a-Si film 102 and the a-Si film 104 is 272 nm. In other words, the a-Si films 102 and 104 having a thickness approximately equal to the set film thickness were formed. In FIG. 23, a thickness L22 of the W film 105 was 69.3 nm and a thickness L23 of the a-Si film 102 was 147 nm. It can be seen from this result that the a-Si film 102 below the reaction blocking layer 103 remains without reacting with the $WF_6$ gas. In other words, it was confirmed that the reaction of the $WF_6$ gas and the a-Si film below the reaction blocking layer 103 could be blocked by the reaction blocking layer 103. Accordingly, it was confirmed that the method of this evaluation test 4 could control the thickness of the W film 105 with higher precision than the methods of the evaluation tests 1 to 3 where the reaction blocking layer 103 was not formed, thereby preventing peeling-off of the W film 105.

Evaluation Test 5

According to the above first embodiment, the wafer 10 was processed to form the W film 105. A cross-section of each film of the wafer 10 was observed after the formation of the W film 105. In this test, the thicknesses of the a-Si films 102 and 104 were set to 150 nm and 100 nm, respectively, like those in the evaluation test 4. In this evaluation test 5, 100 wafers 10 were mounted on the wafer boat 4 and were processed collectively. For this process, the $O_2$ gas of Step S7 in FIG. 2 was supplied for 2 minutes, and the $WF_6$ gas was supplied for 30 minutes.

Figure 24:
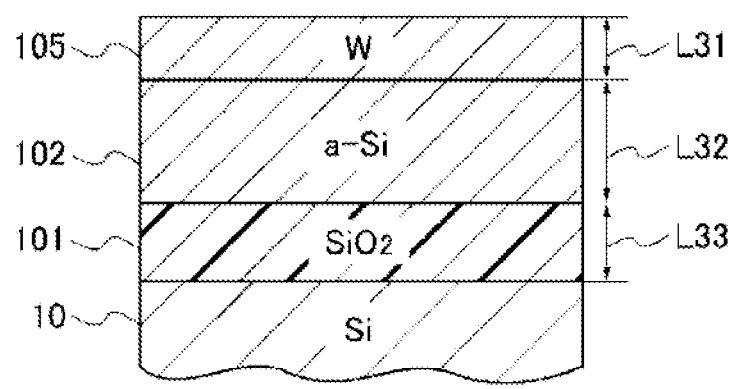
FIG. 24 is a longitudinal cross-sectional view of films formed on a wafer in an evaluation test.

After completion of this process, a wafer 10 (an upper side wafer 10) mounted on the upper side of the loading area on which the wafers 10 of the wafer boat 4 are loaded, a wafer 10 (a middle portion wafer 10) mounted on the middle portion of the loading area, and a wafer 10 (a lower side wafer 10) mounted on the lower side of the loading area were taken out. Cross-sections of a central portion and a peripheral portion of each of the taken wafers 10 were observed. It was confirmed from the observation that a stacked film including the W film 105, the a-Si film 102, and the $SiO_2$ film 101 was formed in both of the observed central and peripheral portions of each wafer 10, as shown in FIG. 24.

Further, a thickness L31 of the W film 105, a thickness L32 of the a-Si film 102, and a thickness L33 of the $SiO_2$ film 101 in the observed central and peripheral portions of each wafer 10 were measured, respectively. For the central portion of the upper side wafer 10, the thicknesses L31, L32 and L33 were 67.0 nm, 144 nm and 95.0 nm, respectively. For the peripheral portion of the upper side wafer 10, the thicknesses L31, L32 and L33 were 73.0 nm, 145 nm and 94.0 nm, respectively. For the central portion of the middle portion wafer 10, the thicknesses L31, L32 and L33 were 70.0 nm, 151 nm and 93.0 nm, respectively. For the peripheral portion of the middle portion wafer 10, the thicknesses L31, L32 and L33 were 75.0 nm, 146 nm and 92.0 nm, respectively. For the central portion of the lower side wafer 10, the thicknesses L31, L32 and L33 were 72.0 nm, 149 nm and 92.0 nm, respectively. For the peripheral portion of the lower side wafer 10, the thicknesses L31, L32 and L33 were 65.0 nm, 149 nm and 92.0 nm, respectively.

In this manner, each of the films has substantially the same thickness in the plane of the same wafer 10 and among different wafers 10. Further, the peeling-off of the W film as shown in the evaluation test 3 was not observed in the evaluation test 5. In other words, according to the mask structure forming method of the present disclosure, the W film 105 and the a-Si film 102 may be substantially similarly formed on a number of wafers 10 collectively in the reaction container 2.

The peeling-off of the W film 105 may also be prevented. Therefore, it was confirmed from the evaluation test 5 that the present disclosure could achieve an improved throughput and prevent reduction of yield.

Evaluation Test 6

According to the second embodiment, the wafer 10 was processed to form a W film having a large thickness by stacking a plurality of W layers having a small thickness. After forming the W film, Si and W concentrations (atom %) in the W film were measured using SIMS (Secondary Ion Mass Spectrometry). In this process, the film forming apparatus was set to form the W film by stacking five 50 nm-thick W layers, five 20 nm-thick W layers and twenty 10.5 nm-thick W layers, respectively. Further, although O and C were measured using the SIMS, they were barely detected.

Figure 25:
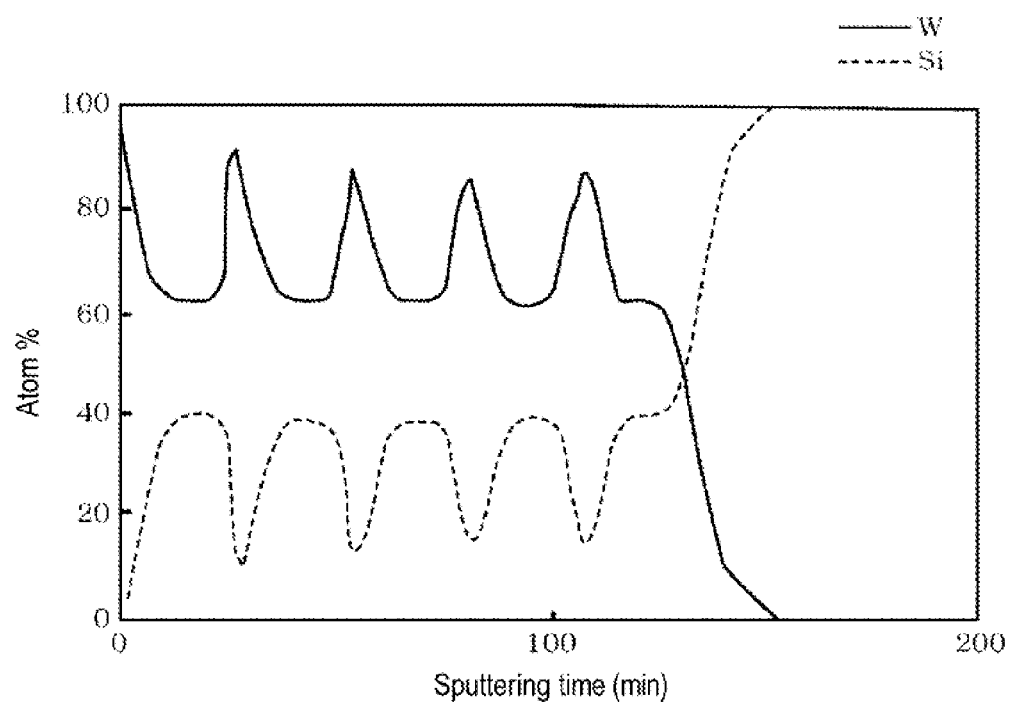
FIG. 25 is a characteristics diagram showing composition ratios of atoms in a thickness direction of a wafer in an evaluation test.
Figure 26:
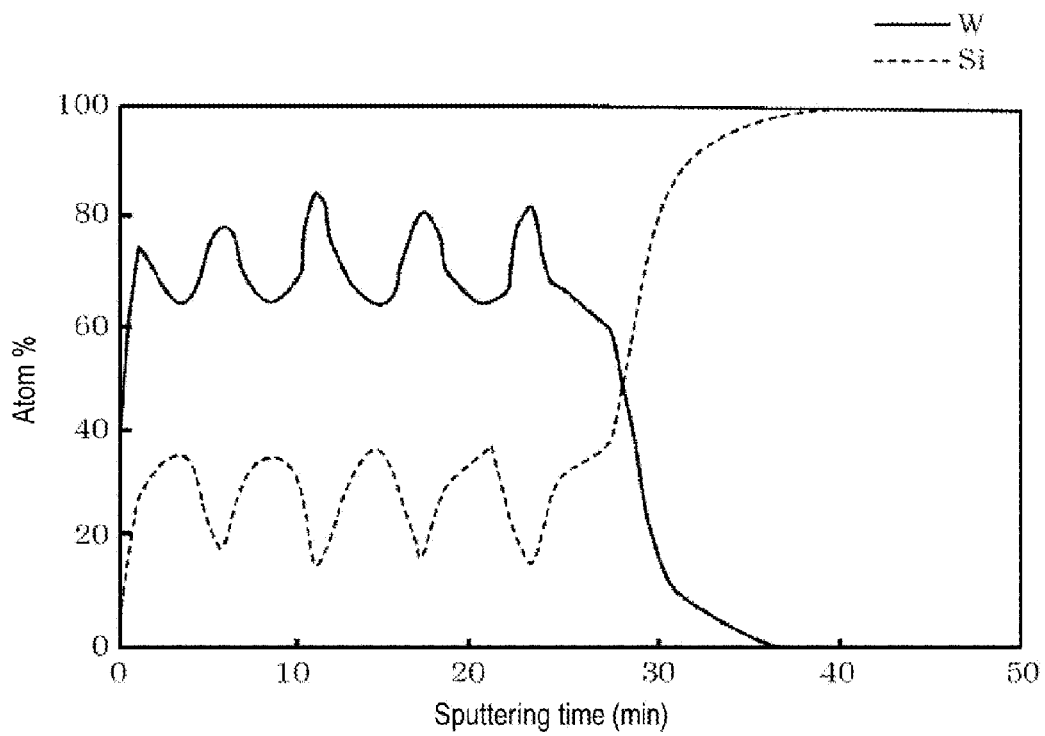
FIG. 26 is a characteristics diagram showing composition ratios of atoms in a thickness direction of a wafer in an evaluation test.
Figure 27:
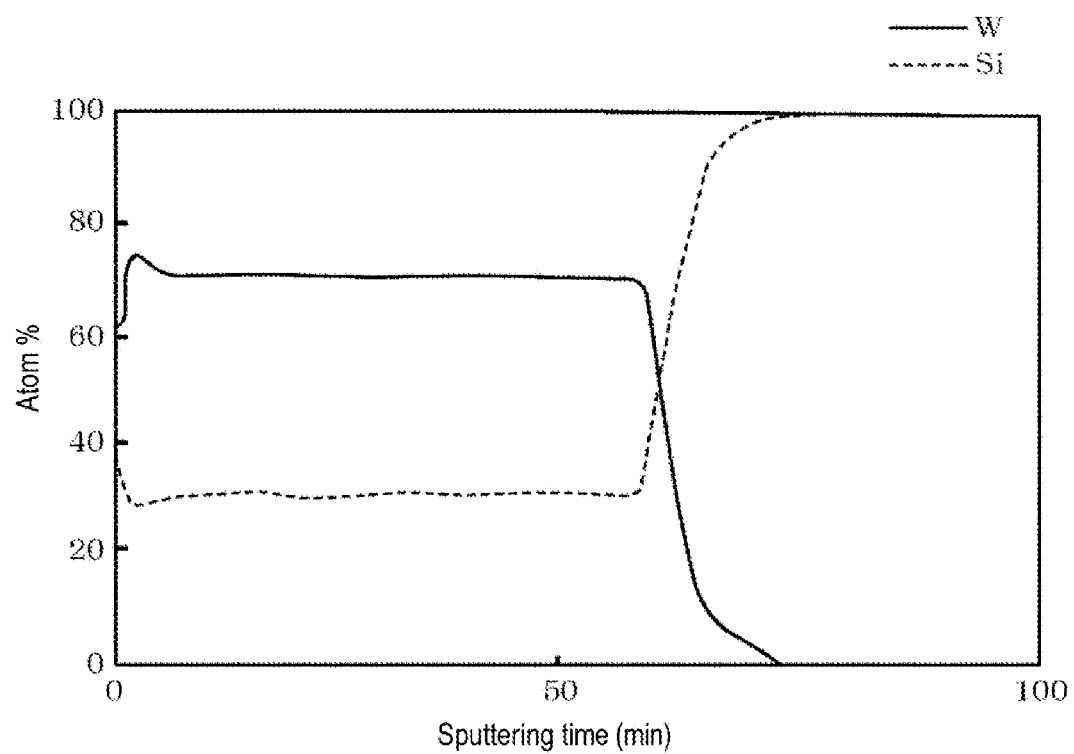
FIG. 27 is a characteristics diagram showing composition ratios of atoms in a thickness direction of a wafer in an evaluation test.

FIGS. 25 to 27 show these results and are characteristics diagrams showing composition ratios of elements detected over sputtering time in SIMS when five 50 nm-thick W layers were stacked, when five 20 nm-thick W layers were stacked, and when twenty 10.5 nm-thick W layers were stacked, respectively. In FIGS. 25 and 26, valleys of Si (peaks of W) correspond to boundaries of W layers. It can be seen from FIGS. 25 and 26 that the W concentration is high in the surface of each W layer and decreases with depth (i.e., the Si concentration increases). Further, it can be seen from comparison between FIGS. 25 and 26 that the 20 nm-thick W layer is higher in uniformity of the Si concentration (W concentration) in depth of each W layer than the 50 nm-thick W layer. In addition, it can be seen from FIG. 27 that the 10.5 nm-thick W layer shows little difference in the W concentration (Si concentration) in depth.

According to this result, in the second embodiment, the uniformity of the Si concentration (W concentration) in depth became better by stacking a number of thin W layers by repeating the supply of $SiH_4$ gas and the supply of $WF_6$ gas. In this case, it can be seen that the uniformity of the Si concentration (W concentration) in depth tends to become better by making the thickness per W layer thinner.

Evaluation Test 7

W films were formed according to the following methods and surface roughnesses of the W films were evaluated.

(Evaluation Test 7-1)

According to the second embodiment, three W films were obtained by stacking one 45 nm-thick W layer, two 45 nm-thick W layers, and five 45 nm-thick W layers, respectively. The surface roughnesses (Ra: Arithmetic Average Roughness) of these three W films were measured using AFM (Atomic Force Microscopy). Although the single-layered W film is the same as a 45 nm-thick W film in evaluation test 7-3 as described later, the single-layered W film is described to be included in evaluation test 7-1 for the purpose of easy understanding of the results of the evaluation.

(Evaluation Test 7-2)

According to the second embodiment, two W films were obtained by stacking five 20 nm-thick W layers and ten 20 nm-thick W layers, respectively. The surface roughnesses of these two W films were measured as well.

(Evaluation Test 7-3)

According to the first embodiment, four W films were obtained by forming a 30 nm-thick W layer, a 45 nm-thick W layer, a 70 nm-thick W layer and a 120 nm-thick W layer once, respectively. The surface roughnesses of these four W films were measured as well.

Figure 28:
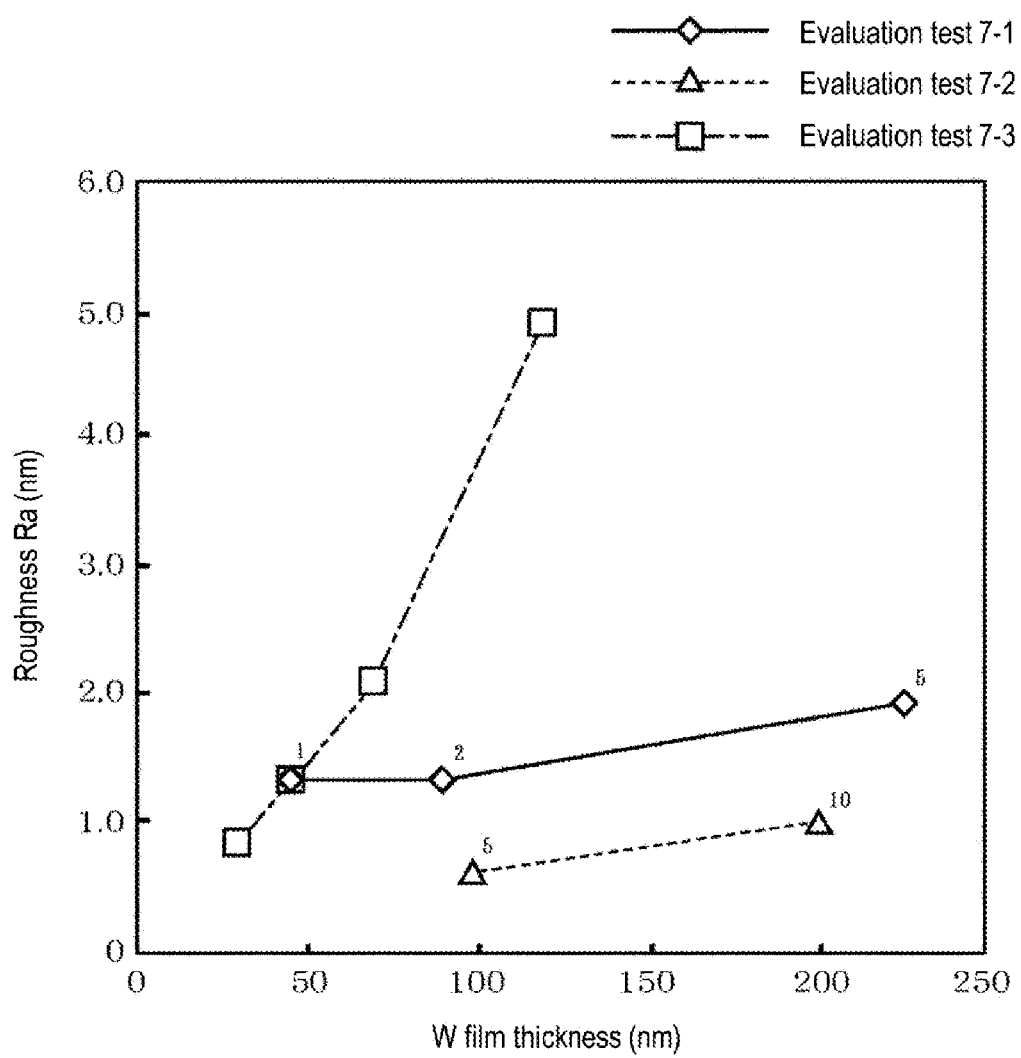
FIG. 28 is a characteristics diagram showing wafer surface roughness in an evaluation test.

FIG. 28 is a graph showing a relationship between thickness and roughness of the W films obtained in the evaluation tests 7-1 to 7-3, in which "◇" indicates the result of the evaluation test 7-1, "Δ" indicates the result of the evaluation test 7-2, and "□" indicates the result of the evaluation test 7-3. In addition, in FIG. 28, numerical values attached to plots indicate the number of W layers.

It can be seen from these results that the roughness of one-layered W film increases with an increase of its thickness. As described in the second embodiment, it can be seen that the roughness becomes small when thin W layers are stacked by repeating the supply of $SiH_4$ gas and the supply of $WF_6$ gas. Further, it can be seen that roughness of a W film formed by stacking ten 20 nm-thick W layers is less than a W film formed by stacking five 45 nm-thick W layers. Accordingly, it was shown from the evaluation test 7 that, according to the second embodiment, the surface roughness may be suppressed and the roughness may be improved by decreasing the thickness of each of stacked W layers.

According to the present disclosure in some embodiments, a reaction blocking layer is formed on a surface layer of a first silicon film provided on an insulating film mainly containing silicon and oxygen, and a second silicon film is stacked on the reaction blocking layer. Then, the second silicon film is replaced with a tungsten film using a tungsten film forming gas. With this configuration, since silicon of the first silicon film can be prevented from being replaced with tungsten, the thickness of the tungsten film can be controlled with high precision. Further, since the tungsten film can be prevented from being formed adjacent to the insulating film, the tungsten film can be prevented from being peeled off.

While certain embodiments have been described, these embodiments have been presented by way of example only, and are not intended to limit the scope of the disclosures. Indeed, the embodiments described herein may be embodied in a variety of other forms. Further, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming an etching mask structure on an insulating film containing silicon and oxygen, comprising:
    forming a first silicon film on the insulating film formed on a substrate;
    forming a reaction blocking layer on a surface layer of the first silicon film;
    forming a second silicon film on the reaction blocking layer; and
    forming a tungsten film by replacing silicon of the second silicon film with tungsten by supplying a process gas containing a tungsten compound onto the second silicon film.

2. The method of claim 1, wherein the reaction blocking layer is an oxidation layer or a niridation layer formed by oxidizing or nitriding the surface layer of the first silicon film.

3. The method of claim 1, wherein the first and second silicon films are formed of amorphous silicon.

4. The method of claim 1, wherein the tungsten compound is tungsten halide.

5. The method of claim 1, further comprising:
    forming a third silicon film on the tungsten film; and
    forming a tungsten film by replacing the third silicon film with the tungsten film by supplying the process gas onto the substrate.

6. The method of claim 1, further comprising:
    forming a third silicon film on the tungsten film;
    forming a reaction blocking layer on the surface layer of the third silicon film;

forming a fourth silicon film on the reaction blocking layer; and forming a tungsten film by replacing silicon of the fourth silicon film with tungsten by supplying a process gas containing a tungsten compound onto the fourth silicon film.

* * * * *